United States Patent [19]

Cabaud

[11] 4,037,915

[45] July 26, 1977

[54] ELECTRICAL CONNECTOR STRIPS

[75] Inventor: Aimé Cabaud, Versailles, France

[73] Assignee: COMATEL - Comptoir Europeen de Materiel Electronique, Issy les Moulineaux, France

[21] Appl. No.: 681,488

[22] Filed: Apr. 29, 1976

[51] Int. Cl.[2] ........................ H01R 13/12; H05K 1/07

[52] U.S. Cl. ........................... 339/258 P; 339/276 SF

[58] Field of Search ............. 339/17 C, 258 R, 258 P, 339/258 F, 276 SF, 176 MP; 29/628, 629, 630 B, 630 D; 113/119

[56] References Cited

U.S. PATENT DOCUMENTS 3,865,459 2/1975 Mills .............................. 339/276 SF 3,865,462 2/1975 Cobaugh et al. ................ 339/258 R

FOREIGN PATENT DOCUMENTS 1,374,648 8/1964 France ............................ 339/258 R

*Primary Examiner*—Roy Lake
*Assistant Examiner*—Neil Abrams
*Attorney, Agent, or Firm*—Amster & Rothstein

[57] ABSTRACT

A connector strip for circuit boards comprises a series of parallel connectors. One end portion of each connector is intended to be soldered to a conductor or to be inserted into a printed circuit, the other end portion of each connector being intended to be inserted onto circuit boards. The connectors are interconnected in the strip at each of their end portions.

3 Claims, 7 Drawing Figures

Fig. 1
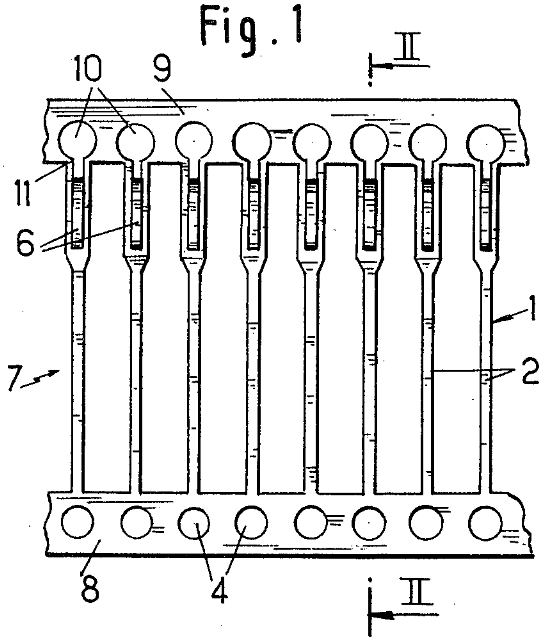
Fig. 2
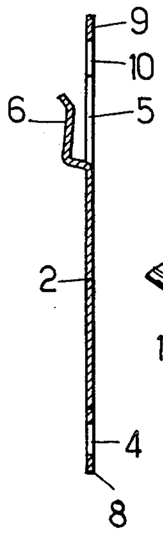
Fig. 3
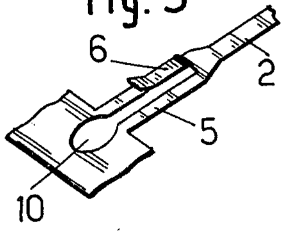
Fig. 4
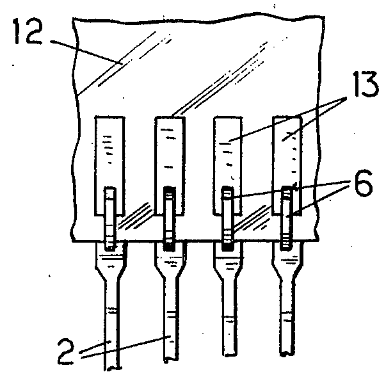
Fig. 5
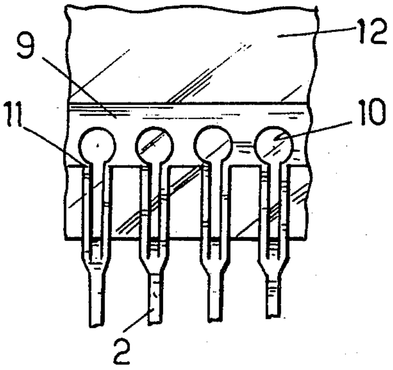
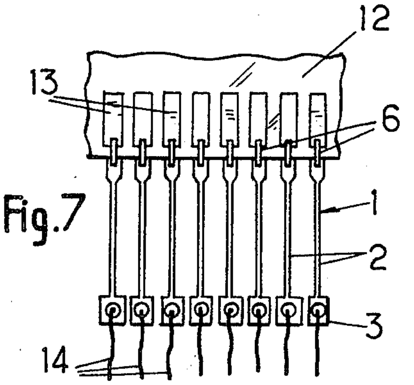
Fig. 7
Fig. 6
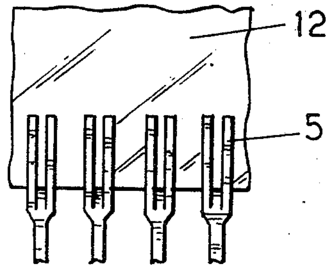

ELECTRICAL CONNECTOR STRIPS

BACKGROUND OF THE INVENTION

1. Field of the Invention

The present invention relates to connectors for use with circuit boards for example printed circuits on which are formed such components as resistors or capacitors.

2. Description of the Prior Art

It has been proposed to provide connectors for use with circuit boards in the form of a strip of spaced parallel connectors interconnected at one end portion to enable a group of connectors to be inserted into a hole of a printed circuit. A section of the strip containing the required number of connectors is cut from the remainder of the strip, the group of connectors is inserted into the circuit as a whole. A section of the strip containing the required number of connectors is cut from the remainder of the strip, the group of connectors is inserted into the circuit as a whole, the connectors are soldered to the circuit, and then the connectors are separated from each other. However the connectors are relatively weak and during insertion of the connectors, the connectors of the group are liable to twist and to move out of their parallel arrangement with the result that insertion of the connectors becomes difficult.

An object of the present invention is to provide a series of connectors which are stronger, easier to install and which remain parallel whilst being installed.

SUMMARY OF THE INVENTION

According to the present invention, there is provided in a connector strip for a circuit board, a plurality of solderable connectors each having first and second opposed end portions, said first end portions being intended for insertion into a printed circuit or for soldered connection to a conductor, and said second end portions being intended to be inserted onto a circuit board, first connecting means interconnecting the connectors at their first end portions, and second connecting means interconnecting the connectors adjacent their second end portions.

In one preferred embodiment of the invention, the connectors are connected to each other by a continuous strip extending beyond the end portion intended to be inserted onto the circuit board.

Since the connectors in the strip are interconnected at both their end portions, the strip forms a relatively robust assembly in which the connectors remain parallel. It is sufficient to separate them from each other when the connections have been established.

BRIEF DESCRIPTION OF THE DRAWINGS

An embodiment of the invention will now be described, by way of example only, with reference to the accompanying diagrammatic drawings, in which:

FIG. 1 is a plan view of a set of connectors in accordance with the invention;

FIG. 2 is a section taken on line II—II of FIG. 1;

FIG. 3 is a perspective view showing a detail of one connector;

FIG. 4 is a plan view of part of a circuit board in which is installed a series of connectors in accordance with the invention;

FIG. 5 is a view from below corresponding to FIG. 4;

FIG. 6 is a view similar to FIG. 5, after removal of the connecting strip; and

FIG. 7 is a plan view showing the connectors installed on the circuit board, after separation of the connectors.

DESCRIPTION OF THE PREFERRED EMBODIMENTS

As shown in FIGS. 6 and 7 each connector 1 comprises an elongate stem 2 having at one end an enlarged portion 3 pierced by a hole 4; at its other end, the stem carries a clamp comprising a fork 5 and a resilient tongue 6 projecting with respect to the plane of the connector 1.

A set of such connectors 1 is formed in a single strip 7 as shown in FIG. 1 wherein the connectors are connected at one end by a strip 8 at their ends intended to be soldered to a connecting wire or inserted into the hole of a printed circuit, the strip 8 subsequently being divided to form the enlarged portions 3. The ends of the forks 5 are interconnected by a strip 9 provided with a series of holes 10 each aligned with the axis of a respective one of the connectors 1 and with the corresponding fork 5, so that the connection between the strip 9 and the forks 5 is established by portions 11 which are of small width and thus weak. The holes 4 permit the strip to be indexed forwardly during the production of the connectors, and also when placing the connectors in position on a circuit board.

In order that connectors may be attached to a circuit board 12 which comprises connecting areas 13 evenly spaced along one of its edges, the connectors 1 are situated in the strip 7 at the same spacing as the areas 13, and a section comprising the required number of connectors 1 is cut from this strip. The circuit board is inserted into the clamps of the connectors in such manner that the tongues 6 are applied on the areas 13 of the circuit board (FIG. 4). This operation is performed without difficulty, since by being interconnected at each end by the strips 8 and 9, the connectors form a rigid assembly and are kept parallel to each other.

All that remains is to remove the strip 9, which operation is easily performed by bending it over towards the outside of the circuit board 12 due to the narrowness of the portions 11, to solder the tongues 6 on the areas 13, to solder a conductor 14 to each of the extremities of the connectors, and finally to cut the strip 8, in such a manner as to separate the connectors 1 from each other (FIG. 7). If the circuit board is intended to be affixed on a printed circuit, it is sufficient to cut the set of connectors along their stems 2 (FIG. 1). The length of the connectors 1 may be adjusted at will by displacing the cutting line.

What is claimed is:

1. A connector strip for a circuit board comprising a plurality of spaced solderable connectors;

each of said connectors having first and second end portions and a flat central portion extending along a longitudinal axis between said end portions;

a first common connecting element connecting together said first end portions;

each of said second end portions having a fork configuration formed by spaced leg portions;

a second common connecting element connecting together said second end portions;

said second common connecting element having a plurality of openings formed therein, each individual opening being aligned with the axis of respective connectors; and each said opening formed with a keyhole configuration having its round hole opening located within said second common connecting element and its longitudinally extending opening forming the spacing between said leg portions whereby a weakened portion is formed in said second common connecting element at the junction of said round hole opening and said longitudinally extending opening to facilitate removal of said second common connecting element from said connectors.

2. A connector strip according to claim 1 wherein each said second end portion includes a resilient tongue element projecting from an end of said flat central portion and extending over and spaced from said longitudinally extending opening.

3. A connector strip according to claim 1 wherein said first common connecting element includes a series of holes spaced to be each aligned with a respective second end portion.

* * * * *